United States Patent [19]

Ogita

[11] 4,002,991
[45] Jan. 11, 1977

[54] PILOT SIGNAL EXTRACTING CIRCUITRY

[75] Inventor: Minoru Ogita, Hamamatsu, Japan

[73] Assignee: Nippon Gakki Seizo Kabushiki Kaisha, Hamamatsu, Japan

[22] Filed: Jan. 2, 1976

[21] Appl. No.: 646,049

[30] Foreign Application Priority Data

Jan. 29, 1975 Japan .................. 50-12432[U]
May 15, 1975 Japan .................. 50-63707[U]

[52] U.S. Cl. .............................. 328/139; 178/69.1; 179/15 BP; 307/269; 325/49; 325/329; 329/50; 329/110

[51] Int. Cl.² .................. H03B 1/00; H04B 1/68; H03D 3/18

[58] Field of Search .......... 307/269; 328/139, 138, 328/140; 325/49, 329; 179/15 BP; 178/69.5 R; 329/50, 104, 110

[56] References Cited

UNITED STATES PATENTS

| | | | |
|---|---|---|---|
| 3,611,161 | 10/1971 | Claxton | 328/139 |
| 3,660,607 | 5/1972 | Mack | 329/50 |
| 3,902,014 | 8/1975 | Lindell et al. | 178/69.5 R |
| 3,959,726 | 5/1976 | Hinoshita et al. | 325/49 |

Primary Examiner—Stanley D. Miller, Jr.
Attorney, Agent, or Firm—Cushman, Darby & Cushman

[57] ABSTRACT

A pilot signal extracting circuitry designed to extract, from a composite signal consisting of plural signals modulated by a suppressed carrier modulation system, a pilot signal for controlling the generation of a carrier-wave which is used for the demodulation of the composite signal.

The pilot signal extracting circuitry comprises: a circuit for generating a signal synchronous with the pilot signal contained in the composite signal; a synchronous detector circuit for receiving, as the inputs, the composite signal and the synchronous signal, and for thereby generating a DC voltage having an value proportional to the level of the pilot signal contained in the composite signal; and a pulse-forming circuit for receiving, as the inputs, the DC voltage and the synchronous signal, and for thereby forming a pulse, i.e. the extracted pilot signal, which is synchronous with the synchronous signal and which has an amplitude proportional to the value of the DC voltage. Thus is obtained a stable pilot signal having a correct frequency and phase without distortion or fluctuation and having a magnitude well proportional to the received pilot signal level, which pilot signal is very suitable for demodulation.

9 Claims, 4 Drawing Figures

4,002,991

PILOT SIGNAL EXTRACTING CIRCUITRY

BACKGROUND OF THE INVENTION

1. Field of the Invention

The present invention relates to a pilot signal extracting circuitry designed so that, from a composite signal consisting of plural signals modulated by a suppressed carrier modulation system, is extracted a pilot signal for controlling the generation of a carrier wave which is used for the demodulation of the composite signal.

2. Brief Description of the Prior Art

In demodulating a carrier-suppressed modulated wave (a wave modulated by the suppressed carrier modulation system), it is required to generate a carrier wave which is synchronous with the carrier wave used in the modulation. For this purpose, generally there is added, to the carrier-suppressed modulated wave, a control signal or the so-called pilot signal for controlling the generation of a carrier wave which is used for the demodulation of the carrier-suppressed modulated wave.

The modern FM stereo broadcasting, for example, is conducted with a suppressed carrier AM-FM modulation system, generally called a pilot-tone system, which is modification of the suppressed carrier modulation system. FM stereo receivers for receiving such FM stereo broadcasting wave and reproducing the stereophonic sounds is designed so that the received broadcasting wave is FM-demodulated by an FM detector into the composite signal of a main-channel signal, a sub-channel signal and a pilot signal (19kHz), and this composite signal is then demodulated by a stereo adapter into signals of the left channel and the right channel. The stereo adapter described above is adapted to receive a carrier wave (38kHz), in addition to the main- and the sub-channel signals. This carrier wave is synchronous with the sub-carrier wave (38kHz) for the modulation of the sub-channel signal (the differential signal of the left- and right-channel signals) generated at the broadcasting station. In the conventional FM stereo receiver, the carrier wave which is used for demodulation of the received signal is usually obtained by doubling the frequency (19kHz) of the pilot signal extracted from the composite signal.

In order to accomplish this extraction of the pilot signal from the composite signal, it has been the practice to use a band-pass filter having such characteristics as shown in FIG. 1. As band-pass filter, there has been used in general an LC filter which is composed of a single or plural inductance element(s) and capacitance element(s). With an LC filter, however, the center frequency of the passing band thereof corresponding to the pilot signal frequency (*fp*: 19kHz) and the quality factor Q thereof tend to vary owing to the ambient temperature or for other reasons, so that the amplitude and the phase of the extracted pilot signal often tend to fluctuate. In addition, this band-pass filter is required to have a considerably high selectivity. However, the enhancement of its selectivity will, in turn, result in a steep phase-characteristic curve, and accordingly the phase of the extracted pilot signal will often tend to become unstable.

SUMMARY OF THE INVENTION

It is, therefore, a primary object of the present invention to provide a pilot signal extracting circuitry which is capable of extracting, from a composite signal, a pilot signal having a correct frequency and phase without distortion or fluctuation and having an amplitude well proportional to the level of the pilot signal contained in the composite signal.

Another object of the present invention is to provide a pilot signal extracting circuit of the type described above, which is of a simplified arrangement.

These and other objects as well as the merits of the present invention will become apparent by reading the following detailed description of the present invention when taken in conjunction with the accompanying drawings.

DETAILED DESCRIPTION OF THE PREFERRED EMBODIMENTS

Figure 1:
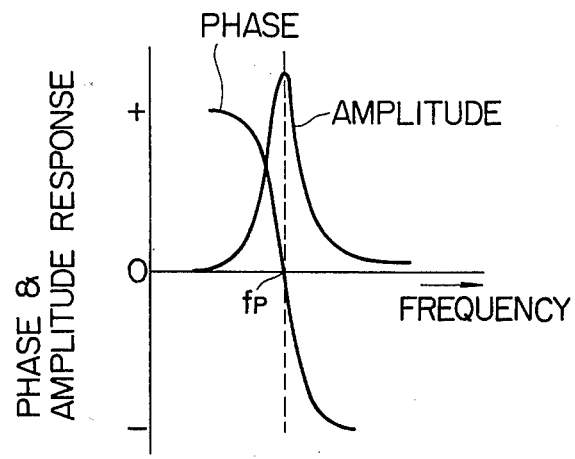
FIG. 1 is a chart showing a typical characteristic of the prior art band-pass filter for extracting a pilot signal from a composite signal.
Figure 2:
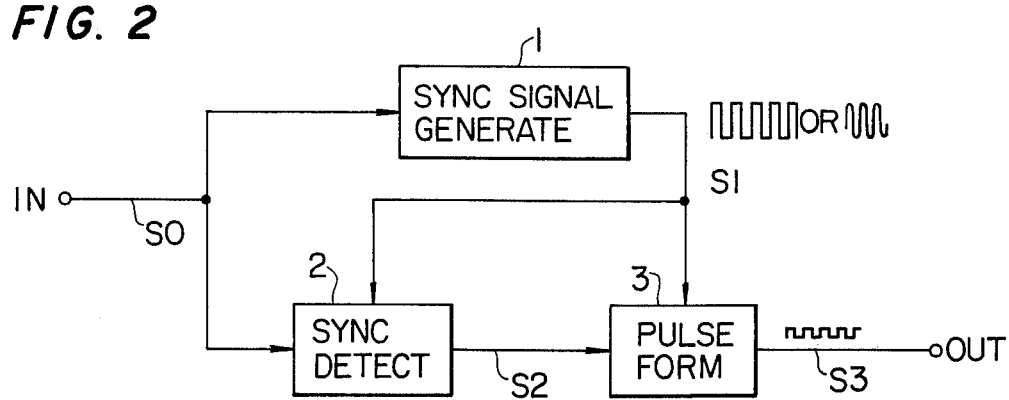
FIG. 2 is a block diagram showing the basic arrangement of a pilot signal extracting circuitry according to the present invention.

With reference to FIG. 2, description will hereunder be made to the basic arrangement of the pilot signal extracting circuit according to the present invention. The pilot signal extracting circuit comprises an input terminal IN, a synchronous signal generating circuit 1, a synchronous detector circuit 2, a pulse-forming circuit 3 and an output terminal OUT.

At the input terminal is applied a composite signal S0, such as an output signal of an FM detector in a conventional FM stereo receiver, consisting of plural signals modulated by a suppressed carrier modulation system or the like. The composite signal contains a pilot signal SP which is synchronous with a carrier wave used in the modulation and which usually is of a frequency different from that of the carrier wave.

The synchronous signal generating circuit 1 is designed to generate a synchronous signal S1 (pulsive or sinusoidal) which is synchronous with the pilot signal SP in the composite signal S0 applied thereto as the input. The circuit 1 may be composed of a band-pass filter which permits the pilot signal SP to pass therethrough. In such an instance, however, the band-pass filter does not need to have a very high selectivity as is required for the band-pass filter in the prior art, so that the pass characteristic curve thereof may be made gentle (much less steep). This leads to the fact that, according to the present invention, the band-pass filter is relatively inexpensive and easy to manufacture and is stable in its filtering characteristic. The synchronous signal generating circuit 1 may, alternatively, be composed of a so-called phase-locked loop circuit.

The synchronous detector circuit 2 is designed to receive both the composite signal S0 and the synchronous signal S1 as its inputs, and thereby to generate a DC voltage S2 having a value which is equal or proportional to the level of the pilot signal SP contained in the composite signal S0.

The pulse-forming circuit 3 is assigned to receive the synchronous signal S1 and the DC voltage S2 as its inputs, and thereby to form a pulse S3 which has a magnitude equal or proportional to the value of the DC voltage S2 and which is synchronous with the synchronous signal S1. The resulting pulse S3 thus formed is delivered out, as the extracted pilot signal, from the output terminal OUT. Thus, by the use of the pilot signal extracting circuit according to the present invention, there can be obtained an extracted pilot signal S3 which is substantially synchronous with the pilot signal SP of the composite signal and is proportional, in level, to the pilot signal SP.

The pulse-forming circuit 3 may take any form so long as it is suitable for exhibiting the required functions. As this pulse-forming circuit 3, for example, there may be employed a conventional analog gate which is arranged so as to receive, as its one input, the DC voltage S2 and, as its another input assigned for controlling the ON-OFF action of this gate, the synchronous signal S1. This pulse-forming circuit 3 may be constructed also by the use of a gain-controllable amplifier which is arranged so that the synchronous signal S1 is amplified with an amplification factor corresponding to the value of the DC voltage S2 applied. This arrangement of the pulse-forming circuit 3 is suitable for an instance wherein the amplitude of the synchronous signal S1 remains substantially constant regardless of the level of the pilot signal SP which is applied to the circuitry. For example, said curcuit 3 is useful for being used with a synchronous signal generating circuit 1 representing a phase-locked loop circuit. However, it should be appreciated that even in case where the amplitude of the synchronous signal S1 is not constant, the gain-controllable amplifier may be used as the circuit 3, as will be understood from the following description of an embodiment of the present invention.

Figure 3:
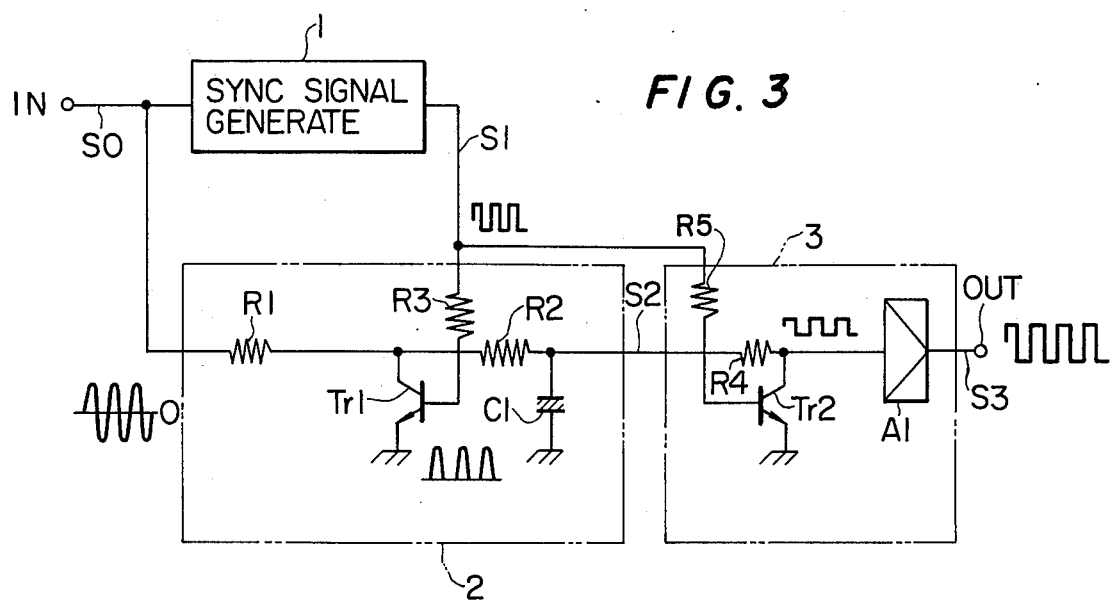
FIG. 3 is a circuit diagram showing an example of a pilot signal extracting circuitry according to the present invention.

FIG. 3 shows an example of the pilot signal extracting circuit according to the present invention. In this example, the synchronous detector circuit 2 comprises a resistor R1 and a transistor Tr1 connected in series between the input terminal IN and the ground, and a resistor R2 and a capacitor C1 connected in series between the collector electrode of the transistor Tr1 and the ground to form an "integration" circuit (not "integrated" circuit). The synchronous signal S1 derived from the circuit 1 is applied to the base electrode of the transistor Tr1 via a resistor R3. During the positive half cycle of the synchronous signal S1, the transistor is biased in the forward direction and is rendered conductive, chopping the composite signal S0 synchronously with the synchronous signal S1 so that a positive half wave component of the composite signal S0 including the positive half wave of the pilot signal SP will appear at the collector electrode of the transistor TR1. The resulting chopped composite signal is integrated and averaged by the integration circuit which is composed of the resistor R2 and the capacitor C1. As a result, a DC voltage S2 with a value proportional to the level or the amplitude of the pilot signal SP is developed across the capacitor C1. It should be understood that the synchronous signal generating circuit of this example may be composed of a band-pass filter.

The pulse-forming circuit 3 of this example is composed of an amplifier A1, a transistor Tr2 and resistors R4 and R5. The DC voltage S2 is inputted through the resistor R4 to the amplifier A1. The input of the amplifier A1 is shunted by the transistor Tr2; to the base electrode of which transistor Tr2 the synchronous signal S1 is applied via the resistor R5.

The transistor Tr2 is biased in the forward direction and is rendered conductive during the positive half cycle of the synchronous signal S1, thereby chopping the DC voltage S2 synchronously with the synchronous signal S1. As a result, a pulse having an amplitude same as the value of the DC voltage S2 and being synchronous with the synchronous signal S1 is inputted to the amplifier A1 and then it is amplified by the amplifier A1 to be delivered out, as the extracted pilot signal S3, from the output terminal OUT.

Thus, according to the present invention, there can be extracted from the composite signal an extracted pilot signal which is substantially synchronous with the transmitted pilot signal which has been contained in the composite signal, and this extracted pilot signal has an amplitude proportional to the level of the transmitted pilot signal.

Figure 4:
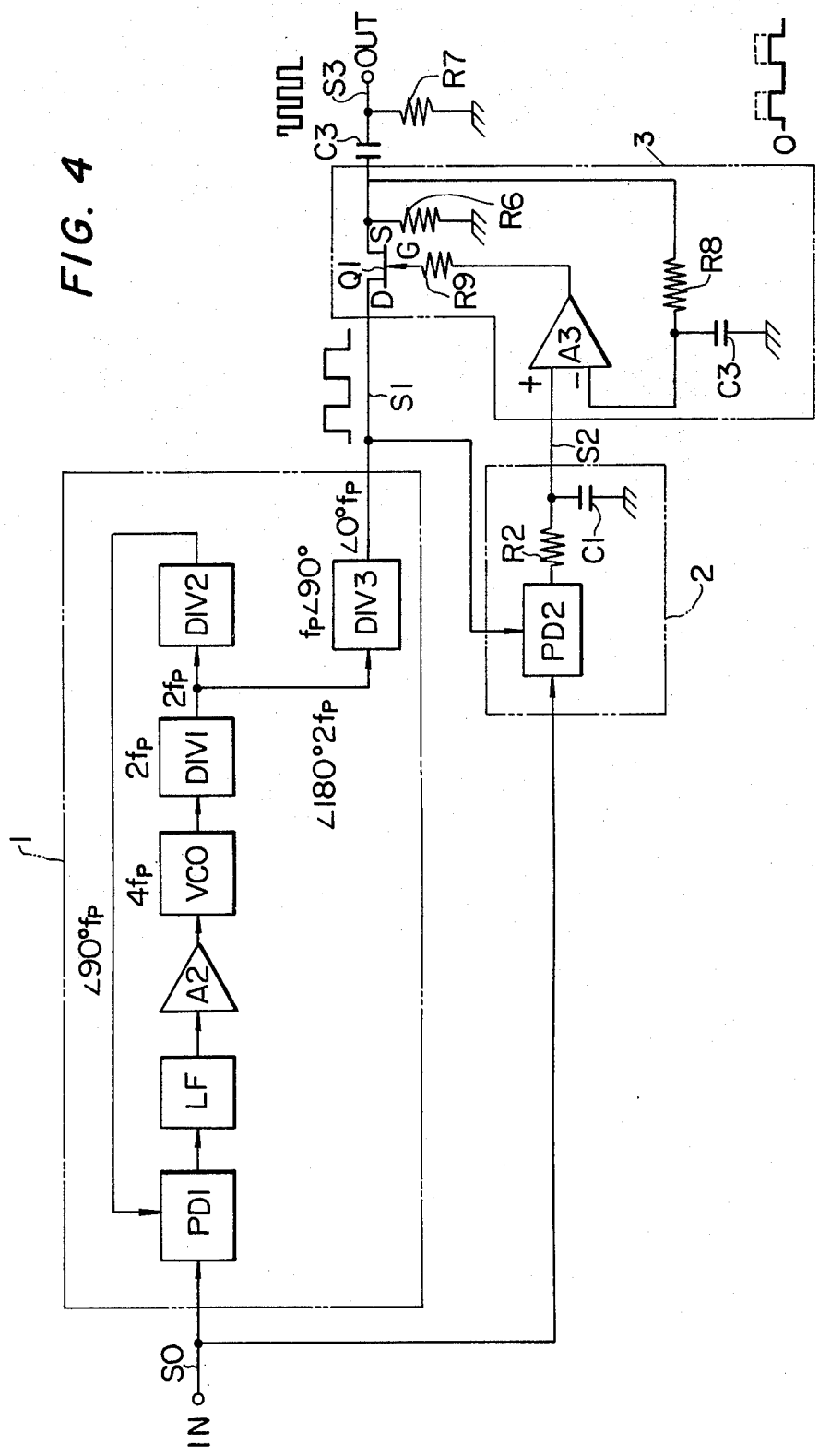
FIG. 4 is a circuit diagram showing another example of a pilot signal extracting circuitry according to the present invention.

In FIG. 4 is shown another example of the pilot signal extracting circuit according to the present invention. The synchronous signal generating circuit 1 in this example has the arrangement which is called a phase-locked loop system, and which comprises, for instance, a phase detector PD1, a low-pass filter LF, an amplifier A2, a voltage-controlled frequency oscillator VCO and frequency dividers DIV1, DIV2 and DIV3. This circuit 1 functions in the manner as stated below. The phase detector PD1 produces a DC voltage having a value proportional to the phase difference between the pilot signal SP of the composite signal S0 and the output signal of the frequency divider DIV2. By the DC voltage derived from the phase detector, the oscillation frequency or the phase of the oscillator VCO is controlled in such a manner that the phase difference between the pilot signal SP of the composite signal S0 and the output signal of the frequency divider DIV2 is kept at 90°. Thus, at the output terminal of the frequency divider DIV3 is obtained a synchronous signal S1 of a constant amplitude which is synchronous with the pilot signal SP in the composite signal S0 and which is of a frequency same as that of the pilot signal SP.

The synchronous detector circuit 2 in this example is comprised of a phase detector PD2 and an integration circuit consisting of a resistor R2 and a capacitor C1. It will be easily understood that the detector circuit 2, upon its receipt, as inputs, of the composite signal S0 and the synchronous signal S1, delivers at its output terminal a DC voltage having a value proportional to the level of the pilot signal SP.

The pulse-forming circuit 3 of this example is a gain-controllable amplifier which is comprised roughly of an FET Q1 (a field effect transistor) as a variable impedance element, and a differential amplifier A3. The FET Q1 has its drain electrode connected to the output terminal of the divider circuit DIV3, and the source electrode of this FET is connected, via a resistor R6, to the ground and, via a network of a capacitor C3 and a resistor R7, to the output terminal OUT. To the two input terminals of the amplifier are connected the output terminal of the synchronous detector 2 and, via an integration circuit of a resistor R8 and a capacitor C3, the source electrode of the FET Q1, respectively. The output terminal of the amplifier A3 is connected via a resistor R9 to the gate electrode of the FET Q1.

The synchronous signal S1 appearing at the source electrode of the FET Q1 is averaged and integrated through the integration circuit, and is applied to one of the input terminals of the amplifier A3 in the form of a DC voltage with its value being proportional to the magnitude of the synchronous signal S1 derived at the source electrode of the FET Q1. The amplifier A3 delivers, at the output terminal thereof, an output voltage having a value proportional to the difference between the two voltages inputted to the input terminals of the amplifier A3. Thus, the internal resistance of the FET Q1 is varied by the output voltage of the amplifier A3 so that the amplitude of the synchronous signal S1 appearing at the source electrode of the FET Q1, i.e. at the output terminal OUT, may be proportional to the value of the DC voltage S2, if the amplifier A3 has a considerably high voltage gain. In other words, a variable voltage divider composed of the FET Q1 and the resistor R6 is controlled of the dividing ratio thereof by the DC voltage S2 so that it delivers, at its output terminal or the output terminal OUT and as the required extracted pilot signal S3, a synchronous signal S1 having an amplitude proportional or equal to the value of the DC voltage S2.

The example of FIG. 4 provides such an advantage that the pilot signal can be extracted in an extremely stable state even if the transmitted pilot signal SP in the composite signal S0 is faint, since it is arranged so as to obtain a synchronous signal S1 by the phase-locked loop system described above.

In addition, the pulse-forming circuit 3 of FIG. 4 is of the arrangement that the output thereof is fed back to the differential amplifier A3, which accounts for accomodation thereto of amplitude fluctuations of the synchronous signal S1. As such, a band-pass filter may be used as the synchronous signal generating circuit 1 in place of the phase-locked loop system.

I claim:

1. A pilot signal extracting circuitry for extracting a pilot signal from a composite signal consisting of plural signals modulated by a suppressed carrier modulation system, comprising:
   a synchronous signal generating circuit for receiving said composite signal and for thereby generating a synchronous signal which is synchronous with the pilot signal contained in said composite signal;
   a synchronous detector circuit for receiving said synchronous signal and said composite signal and for thereby generating a DC voltage having a value proportional to the level of said pilot signal contained in said composite signal; and
   a pulse-forming circuit for receiving said synchronous signal and said DC voltage and for thereby forming a pulse which is synchronous with said synchronous signal and which has a magnitude proportional to the value of said DC voltage,
   said pulse formed by said pulse-forming circuit being used as an extracted pilot signal.

2. A pilot signal extracting circuitry according to claim 1, in which:
   said synchronous signal generating circuit is a band-pass filter whose passing-frequency band has a center frequency thereof substantially equal to the frequency of said pilot signal contained in said composite signal.

3. A pilot signal extracting circuitry according to claim 1, in which:
   said synchronous signal generating circuit is a phase-locked loop circuit.

4. A pilot signal extracting circuitry according to claim 1, in which:
   said pulse-forming circuit is an analog gate, and the passing of said DC voltage through said analog gate is controlled by said synchronous signal.

5. A pilot signal extracting circuitry according to claim 4, in which:
   said analog gate has a transistor which is connected to a signal path for passing said DC voltage therethrough and which has a base electrode to which is applied said synchronous signal.

6. A pilot signal generating circuitry according to claim 1, in which:
   said synchronous detector circuit comprises:
   a transistor connected in parallel between a signal path for passing said composite signal therethrough and the ground of said circuitry, and
   an integration circuit for integrating the voltage appearing between the collector and the emitter electrodes of said transistor.

7. A pilot signal extracting circuitry according to claim 1, in which:
   said synchronous detector circuit comprises:
   a phase detector for receiving said composite signal and said synchronous signal, and an integration circuit for integrating the output signal of said phase detector.

8. A pilot signal extracting circuitry according to claim 1, in which:
   said pulse-forming circuit is a gain-controllable amplifier which amplifies said synchronous signal inputted thereto with an amplitude factor controlled by said DC voltage applied thereto.

9. A pilot signal extracting circuitry according to claim 8, in which:
   said gain-controllable amplifier comprises:
   a voltage divider including a variable impedance element for dividing said synchronous signal applied thereto, and
   a differential amplifier which receives said DC voltage and a DC component of the resultant signal of said synchronous signal after being divided by said voltage divider, and which thereby delivers an output voltage proportional to the voltage difference between said DC voltage and said DC component, said output voltage being applied to the control terminal of said variable impedance element as a control signal for controlling the impedance of said variable impedance and for thereby varying the dividing ratio of said voltage divider, and
   in which: said synchronous signal generating circuit is a phase-locked loop circuit.

* * * * *